(12) United States Patent
Green et al.

(10) Patent No.: US 7,489,524 B2
(45) Date of Patent: Feb. 10, 2009

(54) ASSEMBLY INCLUDING VERTICAL AND HORIZONTAL JOINED CIRCUIT PANELS

(75) Inventors: Ronald Green, San Jose, CA (US); Sridhar Krishnan, Campbell, CA (US); Stuart E. Wilson, Menlo Park, CA (US); James Gill Shook, Santa Cruz, CA (US); Ming Tsai, Sunnyvale, CA (US); Andy Stavros, San Jose, CA (US)

(73) Assignee: Tessera, Inc., San Jose, CA (US)

( * ) Notice: Subject to any disclaimer, the term of this patent is extended or adjusted under 35 U.S.C. 154(b) by 216 days.

(21) Appl. No.: 11/143,201

(22) Filed: Jun. 2, 2005

(65) Prior Publication Data

US 2005/0269693 A1 Dec. 8, 2005

Related U.S. Application Data

(60) Provisional application No. 60/576,170, filed on Jun. 2, 2004.

(51) Int. Cl.
*H05K 1/11* (2006.01)

(52) U.S. Cl. .......................... 361/803; 439/44; 439/65; 439/74; 439/85

(58) Field of Classification Search ................ 438/109; 257/678, 686; 29/840; 361/735, 790, 803; 439/44, 65, 74, 85
See application file for complete search history.

(56) References Cited

U.S. PATENT DOCUMENTS 3,496,634 A * 2/1970 Kurtz et al. .................. 29/860

(Continued)

FOREIGN PATENT DOCUMENTS

DE 41 36 355 A1 5/1993

(Continued)

OTHER PUBLICATIONS

Jensen, Improved Method for Characterizing and Modeling Gigabit Flex-Circuit Based Interconnects, 2001 High-Performance System Design Conference, DesignCon 2001.

(Continued)

*Primary Examiner*—Jeremy C Norris
*Assistant Examiner*—Andargie M Aychillhum
(74) *Attorney, Agent, or Firm*—Lerner, David, Littenberg, Krumholz & Mentlik, LLP

(57) ABSTRACT

An assembly is provided which includes a first circuit panel having a top surface, a first dielectric element and first conductive traces disposed on the first dielectric element. In addition, a second circuit panel has a bottom surface, a second dielectric element and second conductive traces disposed on the second dielectric element, where at least a portion of the second circuit panel overlies at least a portion of the first circuit panel. The assembly further includes an interconnect circuit panel having a third dielectric element which has a front surface, a rear surface opposite the front surface, a top end extending between the front and rear surfaces, a bottom end extending between the front and rear surfaces, and a plurality of interconnect traces disposed on the dielectric element. The bottom end of the interconnect element abuts the top surface of the first circuit panel and the top end abuts the bottom surface of the second circuit panel, where at least some of the first conductive traces are in conductive communication with the second conductive traces through the interconnect traces.

26 Claims, 14 Drawing Sheets

U.S. PATENT DOCUMENTS

| | | | |
|---|---|---|---|
| 3,614,541 A | 10/1971 | Farrand | |
| 4,502,098 A | 2/1985 | Brown et al. | |
| 4,868,712 A | 9/1989 | Woodman | |
| 5,723,901 A | 3/1998 | Katsumata | |
| 6,172,874 B1 | 1/2001 | Bartilson | |
| 6,239,386 B1 * | 5/2001 | DiStefano et al. | 174/262 |
| 6,265,765 B1 * | 7/2001 | DiStefano et al. | 257/678 |
| 6,856,007 B2 | 4/2003 | Warner | |
| 7,033,861 B1 * | 4/2006 | Partridge et al. | 438/109 |
| 2004/0032011 A1 | 2/2004 | Warner | |
| 2004/0238857 A1 | 12/2004 | Beroz et al. | |
| 2006/0008945 A1 * | 1/2006 | Cady et al. | 438/109 |

FOREIGN PATENT DOCUMENTS

| | | |
|---|---|---|
| EP | 1 191 635 A | 3/2002 |
| FR | 2 575 336 A | 6/1986 |
| FR | 2 608 328 A | 6/1988 |
| JP | 11-121896 A | 7/1999 |
| WO | WO-2005/019319 | 3/2005 |

OTHER PUBLICATIONS

Rinne, The Parasitic Reactances of Flip Chip Solder Bumps, Unitive Electronics, Inc., Research Triangle Park, NC, North Carolina State University, Raleigh, NC.

International Search Report, PCT/US2005/019319, Dated Dec. 1, 2005.

* cited by examiner

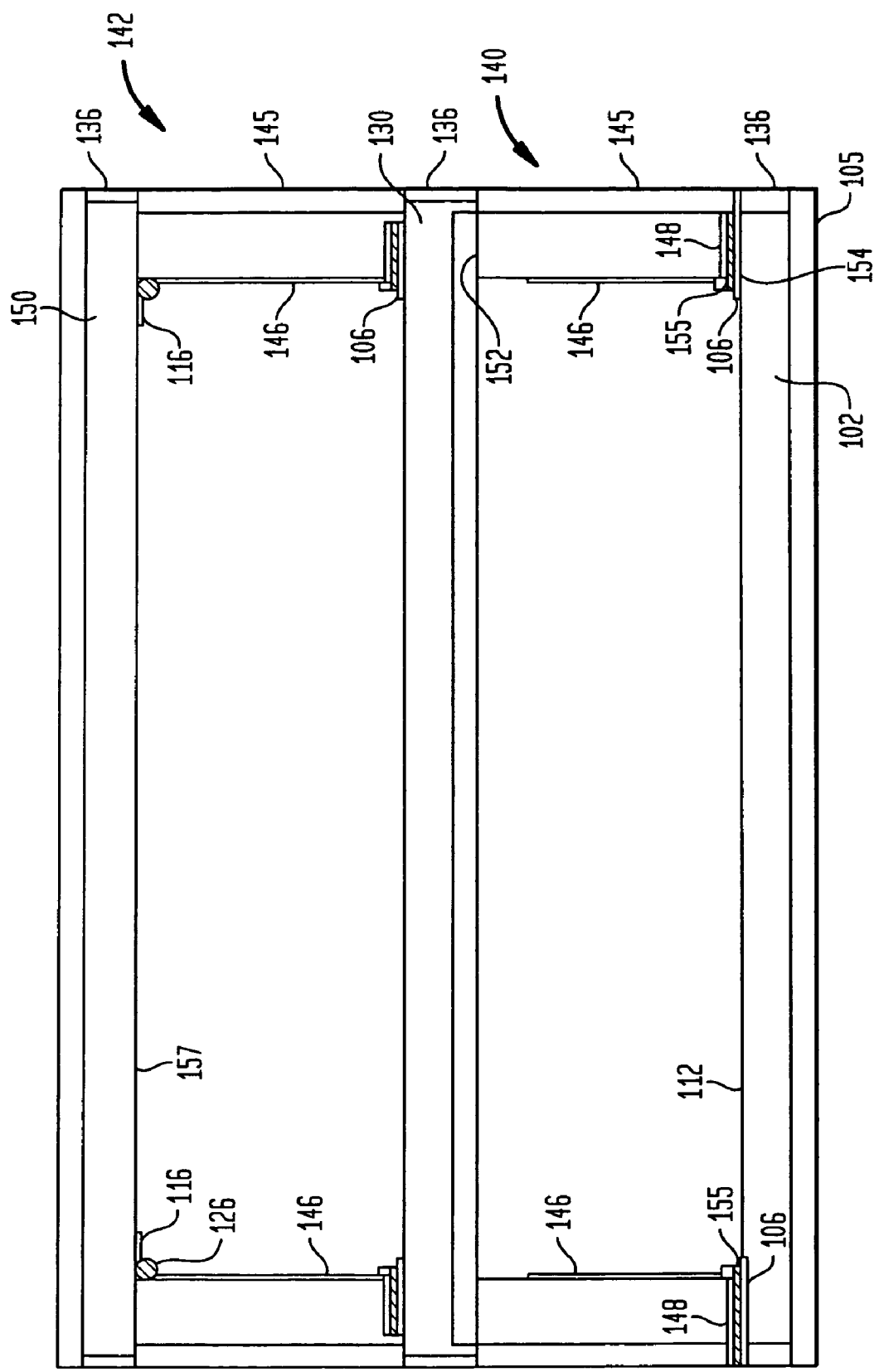

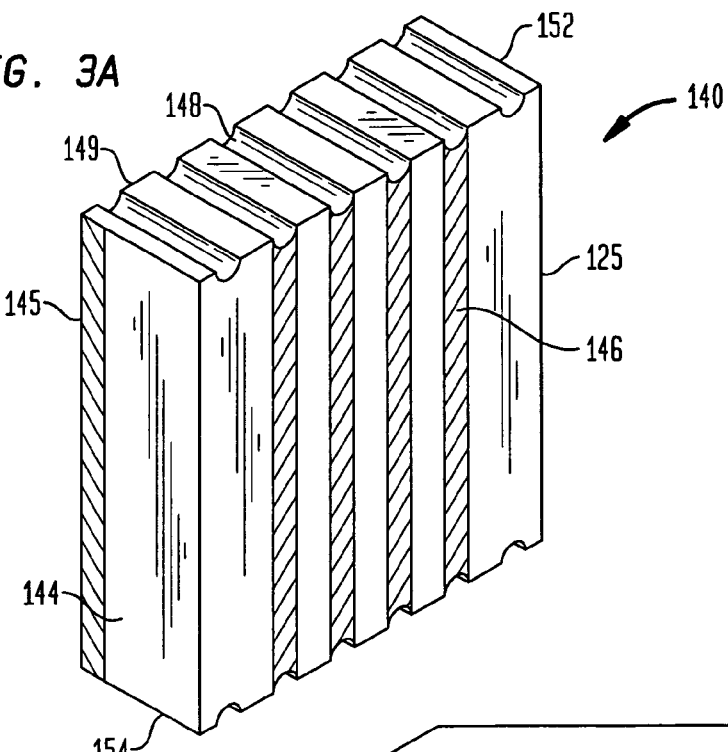
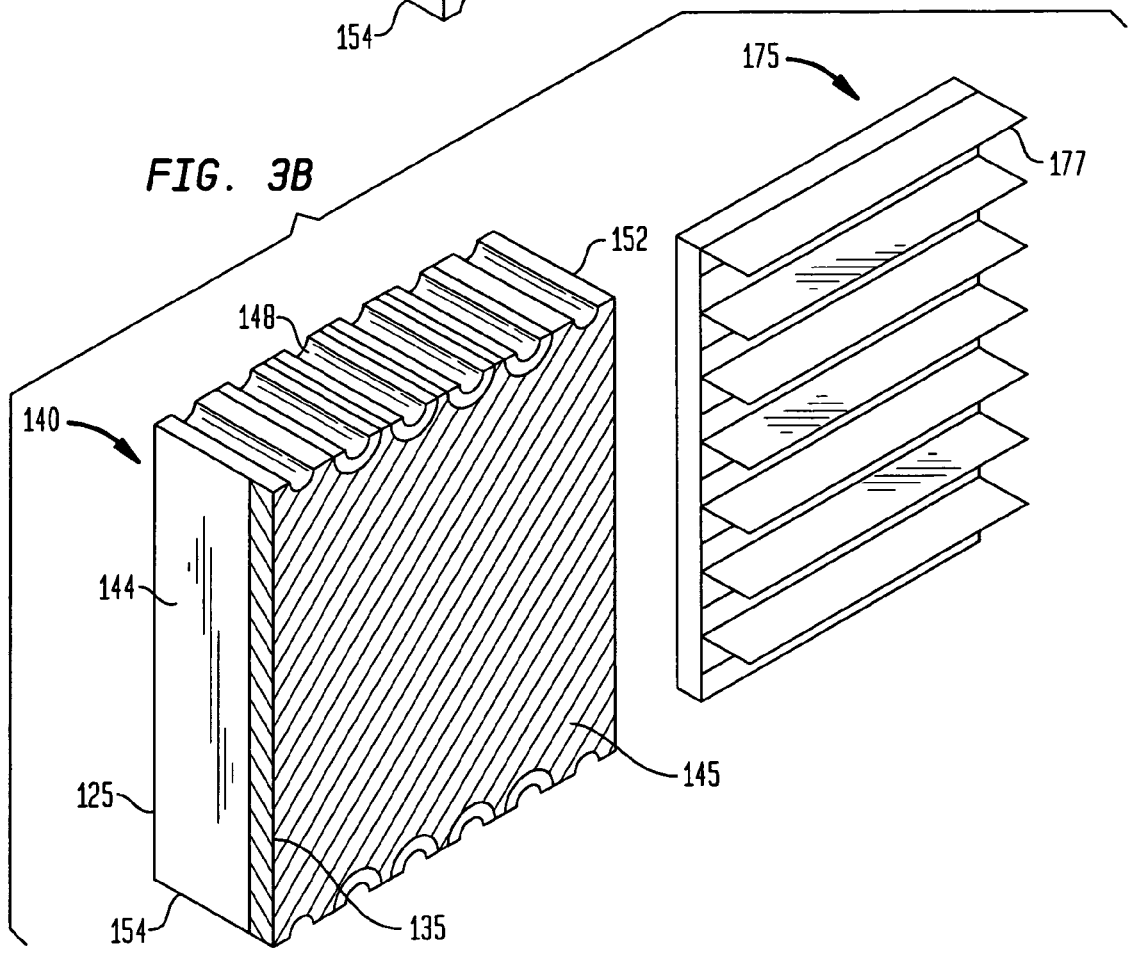

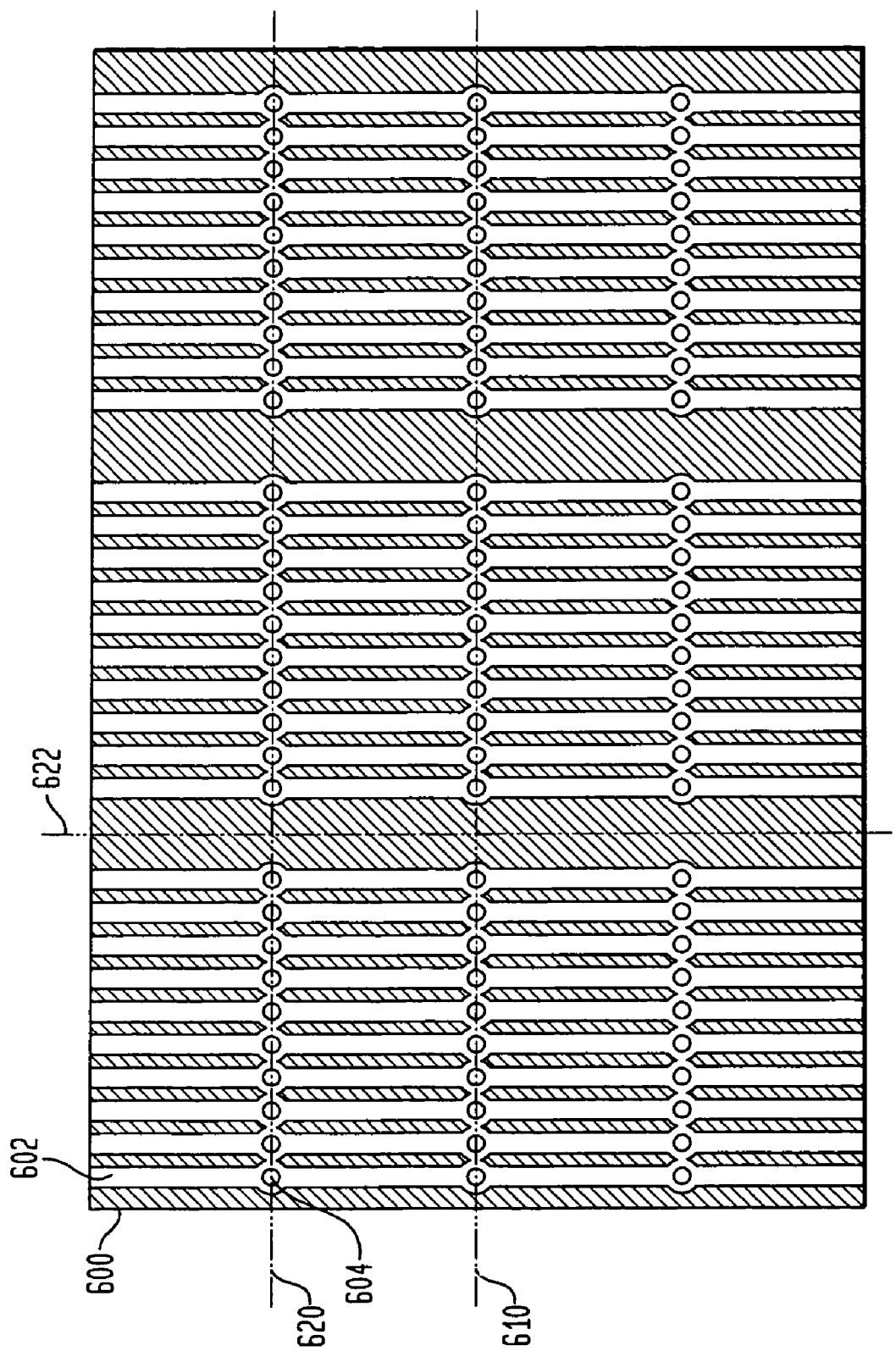

ASSEMBLY INCLUDING VERTICAL AND HORIZONTAL JOINED CIRCUIT PANELS

CROSS-REFERENCE TO RELATED APPLICATIONS

This application claims the benefit of the filing date of U.S. Provisional Patent Application No. 60/576,170 filed Jun. 2, 2004, the disclosure of which is hereby incorporated by reference herein.

BACKGROUND OF THE INVENTION

The present invention relates to microelectronic packaging and microelectronic assemblies.

There is a need in advanced microelectronics for different types of circuitry to be incorporated into a single microelectronic package or microelectronic assembly including a plurality of circuit panels. For example, it would be desirable to incorporate analog, digital and radio frequency amplification and modulation/demodulation circuitry into a single microelectronic package or assembly. Often, the microelectronic package or assembly has an additional requirement to be compact, provide electromagnetic shielding, and be capable of dissipating excess heat, without requiring additional power-consuming components such as fans and refrigeration equipment. A stacked arrangement is desirable for compactness, provided that adequate shielding and heat dissipation are achieved.

The requirements of such packaging pose special challenges. Typically, digital, radio frequency and analog (baseband) circuitry are implemented on different chips. The packaging must route signals, power and ground to and from each of the chips. Radio frequency ("RF") chips have high power consumption and high need for shielding. RF chips also need close proximity to ground and power connections. For these reasons, they are desirably disposed at a lowest level of a stacked package. Digital circuitry, which typically has lower power consumption and less need for shielding and proximity to ground and power, usually tolerates placement on a higher level of a stacked package. Analog circuitry generally has a medium need for shielding and proximity to ground and power. Therefore, analog chips must be placed closer to the lowest level of packaging than the digital circuitry.

Thus, the digital circuitry is desirably placed at the top level of a stacked assembly. Because of this, the package is required to route a significant number of digital signal lines from the top level of the package to lower levels on which an RF circuitry chip (hereinafter, "RF chip") and an analog chip are disposed. At the same time, the package may require the RF signal lines going to and from the RF chip to have well-controlled impedance, and may also require analog signal lines going to and from the analog chip to be shielded differential signal lines.

Multi-layer substrates exist which are capable of implementing the different types of signal lines that are required for carrying digital, analog, and RF signals. However, heretofore, a suitable, cost-effective approach has not been available for interconnecting single conductive layer or multi-layer substrates in a stacked arrangement which satisfies requirements for cost, shielding, controlled impedance signal lines, ground, and/or heat dissipation and for controlling stress due to differential thermal expansion within the package. Moreover, the performance requirements of RF circuitry continue to increase. Required RF signal bandwidth within the package can be 5 to 10 GHz at present, and may increase further in the future.

SUMMARY OF THE INVENTION

According to one aspect of the invention, an assembly is provided which includes a first circuit panel having a top surface, a first dielectric element and first conductive traces disposed on the first dielectric element. In addition, a second circuit panel has a bottom surface, a second dielectric element and second conductive traces disposed on the second dielectric element, where at least a portion of the second circuit panel overlies at least a portion of the first circuit panel. The assembly further includes an interconnect circuit panel having a third dielectric element which has a front surface, a rear surface opposite the front surface, a top end extending between the front and rear surfaces, a bottom end extending between the front and rear surfaces, and a plurality of interconnect traces disposed on the dielectric element. The bottom end of the interconnect element abuts the top surface of the first circuit panel and the top end abuts the bottom surface of the second circuit panel, where at least some of the first conductive traces are in conductive communication with the second conductive traces through the interconnect traces.

According to another aspect of the invention an interconnect element is provided. Such interconnect element includes a dielectric element having a front surface, a rear surface opposite the front surface, and top and bottom surfaces extending between the front and rear surfaces, wherein the top surface is disposed opposite the bottom surface. A plurality of front conductive traces are disposed on the front surface, the front conductive traces extending in a vertical direction between the top surface and the bottom surface. At least one rear conductive element is disposed on the rear surface, the at least one rear conductive element extending in a vertical direction between the top surface and the bottom surface. In addition, at least one of: a) a plurality of top contacts are disposed on the top surface, the plurality of top contacts conductively connected to the front conductive traces and the at least one rear conductive element, or b) a plurality of bottom contacts are disposed on the bottom surface, the bottom contacts conductively connected to the front conductive traces and said at least one rear conductive element.

According to yet another aspect of the invention, an assembly is provided which includes first and second circuit panels each having a top surface, a bottom surface, a side surface extending between the top and bottom surfaces and side terminals disposed on the side surface, the side terminals being conductively connected to conductive traces disposed on at least one of the top and bottom surfaces. An interconnect element includes a dielectric element having a front surface and a plurality of vertically oriented front conductive traces disposed on the front surface. The side terminals of the first and second circuit panels are conductively mounted to the front conductive traces such that the conductive traces of the first circuit panel are conductively connected through the interconnection element to the conductive traces of the second circuit panel.

According to yet another aspect of the invention, a method is provided for making an interconnect element. Such method includes forming a plurality of front conductive traces extending in a first direction over a front surface of a dielectric element. At least one rear conductive element is formed which extends in the first direction over a rear surface of the dielectric element. A plurality of first metalized through holes are formed in a first line extending in a second direction transverse to the first direction. The first metalized through holes extend between the front conductive traces and the rear surface. A plurality of second metalized through holes are formed in the first line, the second metalized through holes extending between the front surface and the at least one rear conductive element. The dielectric element is cut or severed along the first line to cut through the first and second metalized through holes, such that the first and second metalized through holes function as contacts conductively connected to the front conductive traces and the at least one rear conductive element.

BRIEF DESCRIPTION OF THE DRAWINGS

FIG. 2 is a sectional view of the microelectronic assembly in accordance with the embodiment of the invention shown in FIG. 1.

FIG. 3A is a front perspective elevational view of an interconnect element in accordance with one embodiment of the invention.

FIG. 3B is a corresponding rear perspective elevational view of an interconnect element in accordance with the embodiment of the invention illustrated in FIG. 3A.

FIG. 6E is a top-down plan view illustrating a circuit element from which an interconnect panel is fabricated according to one embodiment of the invention.

DETAILED DESCRIPTION

Embodiments of the invention presented herein relate to a new way of interconnecting conductive elements disposed on circuit panels at different levels of a stacked assembly of circuit panels. In such embodiments, a circuit panel having vertically rising conductive elements provides interconnection between horizontally disposed circuit panels at different levels of the stacked assembly. Unless otherwise specified, the terms "horizontal" and "vertical" used herein are not meant to define absolutes, but rather to indicate relationships between elements. Thus, one circuit panel has contacts exposed at a horizontal plane, and a "vertical" circuit panel means one that is oriented in a direction transverse to the horizontal plane.

Commonly owned U.S. patent application Ser. No. 10/746, 810 filed Dec. 24, 2003 entitled "High Frequency Chip Packages With Connecting Elements," the disclosure of which is hereby incorporated herein by reference, describes microelectronic assemblies which include circuit panels. The circuit panels house chips having different types of circuitry. Solder balls are used to interconnect circuit panels at respective levels of the stack. Solder balls are inexpensive and perform satisfactorily over many operating frequencies, but other arrangements may offer greater performance.

Another type of stacked packaging disclosed in U.S. patent application Ser. No. 10/746,810 utilizes a ribbon-like flexible circuit panel on which an RF chip is mounted on a lower level, and the flexible circuit panel is then folded over, and another chip such as a digital or analog chip is mounted to the folded portion. Such arrangement may require routing a relatively high number of signal lines to and from the digital chip to the top of the assembly through each bend of the flexible circuit panel to inputs and outputs at the lowest level of the package. Embodiments of the invention provide alternative ways of routing signal lines between levels in a stacked assembly.

Figure 1:
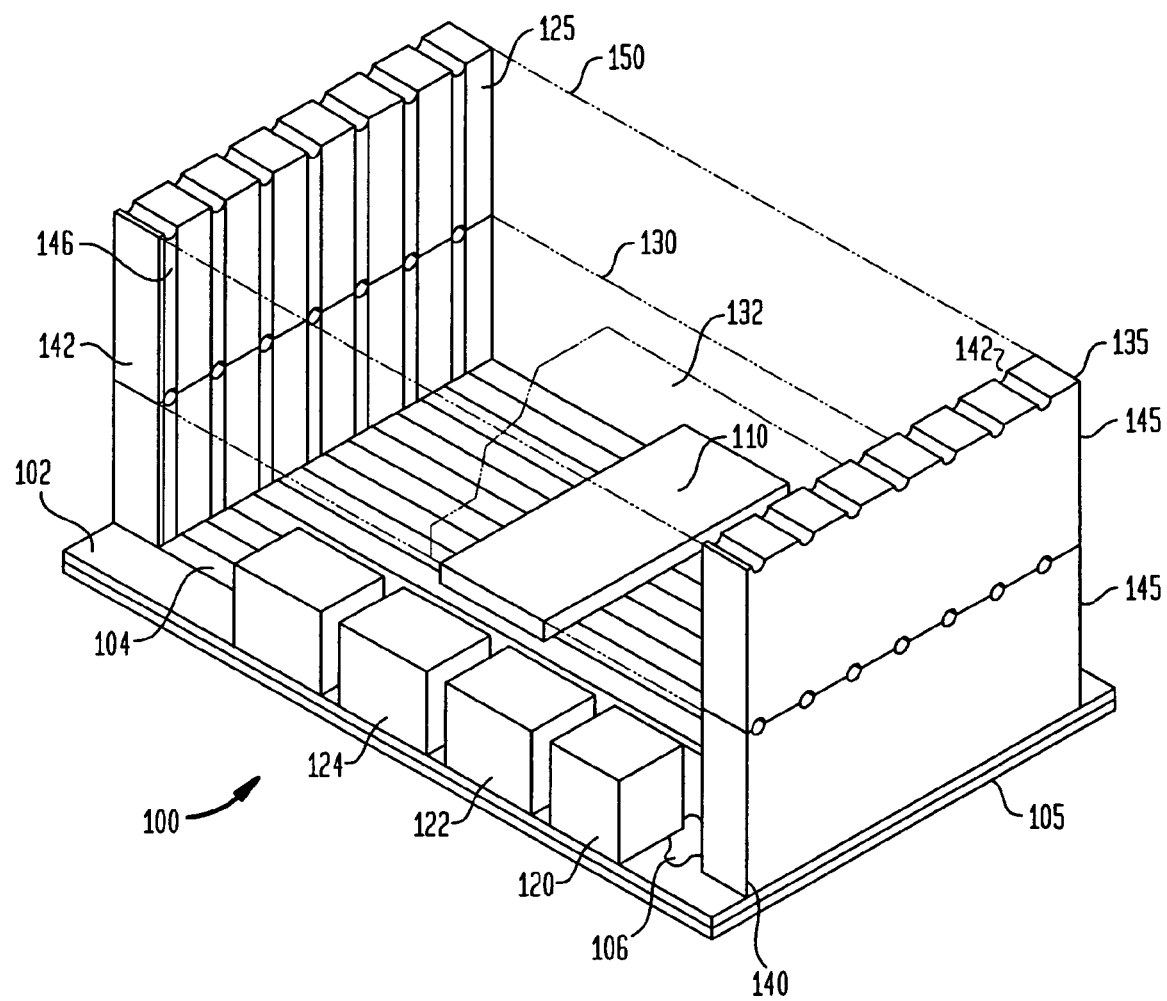
FIG. 1 is a cutaway sectional perspective view illustrating a microelectronic assembly according to an embodiment of the invention.

FIG. 1 is a cutaway sectional view illustrating an embodiment of the invention. As shown therein, an assembly includes a first circuit panel 102, on which a plurality of traces 104 are disposed. The first circuit panel is preferably of the type BT resin, although other preferred types of circuit panels include FR-4 or other epoxy glass resin, or glass. The first circuit panel 102 preferably also includes a plurality of internal traces (not shown) . Some of the traces 104 and the internal traces are connected to terminals 106. Some of the terminals 106 are connected by through holes (not shown) to a conductive plane 105 on a bottom surface of the assembly. The conductive plane 105 preferably includes open areas or other openings in which bottom terminals (not shown) of the first circuit panel are disposed, at least some of the bottom terminals being connected to some of the terminals 106 disposed on the top surface of the first circuit panel.

A plurality of other components such as discrete components, active components or passive components are mounted to terminals of the first circuit panel. Passive components such as passive chips have functions that are generally limited to providing a source of resistance, capacitance or inductance. By contrast, active components such as active chips have additional functions such as amplification, switching, filtering, rectification, regulation, etc., and are not limited to providing resistance, capacitance or inductance. Preferably, an active chip 110 is mounted to a top surface of the first circuit panel. In a preferred embodiment, the active chip is an RF power amplifier (RFPA) chip such as used in an RF transmitter device, or, alternatively, has an RF receiver function. Other active chips, passive chips and/or other components 120, 122, 124 are preferably mounted to a top surface of the first circuit panel.

A second circuit panel 130 is disposed above at least a portion of the first circuit panel 102, the second circuit panel having a construction like that described above for the first circuit panel, the second circuit panel also having components such as chips or other components (not shown) mounted thereon. A third circuit panel 150 is further disposed above at least a portion of the second circuit panel 130, the third circuit panel having a construction like that described above for the first circuit panel, the third circuit panel also having components such as chips or other components (not shown) mounted thereon. In the particular embodiment shown in FIG. 1, the second circuit panel 130 is mounted to the first circuit panels 102 by first level interconnect panels 140. The first level interconnect panels 140 have a bottom surface (not shown) mounted to a top surface of the first circuit panel 102, and the interconnect panels 140 further have a top surface mounted to a bottom surface of the second circuit panel 130. The third circuit panel 150 is mounted to the second circuit panel 130 by second level interconnect panels 142. The second level interconnect panels 142 have a bottom surface (not shown) mounted to a top surface of the second circuit panel 130, and the interconnect panels 142 further have a top surface mounted to a bottom surface of the third circuit panel 150.

FIGS. 3A and 3B are further perspective views of front and back surfaces of an interconnect panel 140 according to a preferred embodiment. While the placement of interconnect panels 140, 142 is different, their structure is preferably the same. Accordingly, the following description applies to both. As shown in FIGS. 3A-3B, each interconnect panel 140 includes a dielectric element 144. Preferably, the dielectric element is of the type BT resin, in order for its coefficient of thermal expansion (CTE) to match that of the first, second and third circuit panels, which are also preferably of that type. Alternatively, the interconnect panels and circuit panels can have dielectric elements made of other dielectric materials that have isotropic CTEs that are preferably the same or close to each other in value. A conductive plane 145 is disposed on a rear surface 135 of the interconnect panel for providing a connection to ground, shielding or a source of power, for example. More preferably, the conductive plane 145 is a ground plane. Preferably, the conductive plane 145 is a continuous and relatively thick element, e.g., about 4 mils or more, for providing both electromagnetic shielding and conduction of heat. Each interconnect panel 140, 142 further includes a plurality of interconnect traces 146 on the dielectric element 144, the interconnect traces formed of a conductive material such as a metal for allowing interconnections to be made to conductive traces 104 and/or terminals 106 of the first, second and third circuit panels. The interconnect traces preferably have spacings of about 200 µm. In one embodiment, the interconnect traces 146 are disposed on a surface of the dielectric element 144, such as a front surface 125, so as to be separated from the conductive plane 145 by the thickness of the dielectric element 144. Preferably, the thickness of the dielectric element 144 is comparable to or the same as that of the circuit panels, e.g., circuit panel 102, and such thickness is preferably constant between the front and rear surfaces 125, 135. Alternatively, a smaller or larger thickness is provided. An arrangement of interconnect traces having a constant spacing relative to the conductive plane is an arrangement of parallel transmission lines. Such transmission line arrangement can be referred to as a microstrip. In another embodiment, interconnect traces are disposed internally within the dielectric element 144. Whether the interconnect traces are disposed on the surface of the interconnect panel or internally, the traces are said to be disposed "on" the interconnect panel.

The interconnect traces 146 are connected to contacts 148 at the top end 152 and like or similar contacts (not shown) at the bottom end 154 of the interconnect panel, such contacts permitting mounting to conductive; elements of the first and second circuit panels. Preferably, as shown in FIGS. 3A and 3B, the contacts 148 are provided as metalized grooves in the surface of dielectric element 144 at the top and bottom ends, the metalized grooves extending at least partially between the interconnect traces 146 on the front surface and the conductive plane 145 on the back surface. Preferably, the height of the interconnect panel from the bottom end 154 to the top end is between about 200 µm and 1 mm for desirable RF signal performance.

FIG. 3B further illustrates a heat dissipating element 175 for mounting to the conductive plane 145 of the interconnect panel 140, the element 175 having a plurality of outwardly extending metal fins 177, for the purpose of increasing heat convection away from the conductive plane of the interconnect panel 140. Such heat dissipating element 175 may be a separate component or may be integrated with the interconnect panel 140, and fabricated together therewith. Alternatively, or in addition to the fins 177, the heat-dissipating element may include heat pipes for conducting heat away from a particular level of the stacked assembly 100, such as a higher level (e.g., the second or third circuit panel levels). Referring again to FIG. 1, the stacked assembly may include additional heat conducting/dissipating elements such as a thermal conductor such as may take the form of a conductive heat slab 132. Such slab preferably is formed of copper or other good heat conductor, the slab being mounted, for example, to a rear surface of an active chip 110 (e.g., an RFPA), that is flip-chip mounted to the first circuit panel 102.

A variation of the above-described embodiment is illustrated in FIGS. 4A through 4D. In such embodiment, the contacts 248 provided at the top end 152 and the bottom end 154 of the interconnect panel 240 are planar or substantially planar elements rather than metalized grooves. In this variation, the contacts 248 extend as planar elements in a direction of a top plane defined by the top surface 249 of the interconnect panel 240. Similarly, the bottom contacts (not shown) extend as planar or substantially planar contacts in a direction of a bottom plane defined by the bottom surface of the interconnect panel.

Preferably, according to this embodiment, the interconnect traces 246 extend substantially within a plane along the front surface 225 of the interconnect panel 240. Planar or substantially planar conductive pads 250 are conductively joined to the interconnect traces 246 at the top end 252 of the interconnect panel and planar or substantially planar conductive pads 251 are conductively joined to the interconnect traces 246 at the bottom end 254 of the interconnect panel 240. The conductive pads are preferably wettable by a fusible conductive medium such as solder, tin or eutectic composition. A set of conductive pads 260 connected to conductive traces 262 are exposed at a top surface 270 of a lower circuit panel 272 or circuit board to be joined to the conductive pads. 251 of the interconnect panel. In such way, conductive pads 251 on the front surface 240 of the interconnect panel are solidly bonded via the fusible conductive medium to the conductive pads 260 adjacent thereto on the top surface 270 of the lower circuit panel 270.

The planar shape of the conductive pads may help to promote greater adhesion with the fusible conductive medium, as compared to the concave metalized grooves present at the top and bottom ends of the above-described interconnect panel which might fail to be contacted over as great a surface area.

In a particular variation, the conductive pads can be formed in a manner appropriate to be joined by conductive paste. In such case, the conductive paste can include any of many well-known conductive paste materials, among which are solder paste, silver-filled epoxy, and many others. In each such case, the paste is applied in a flowable or gel-like form, which hardens subsequently upon application of heat.

Figure 4A:
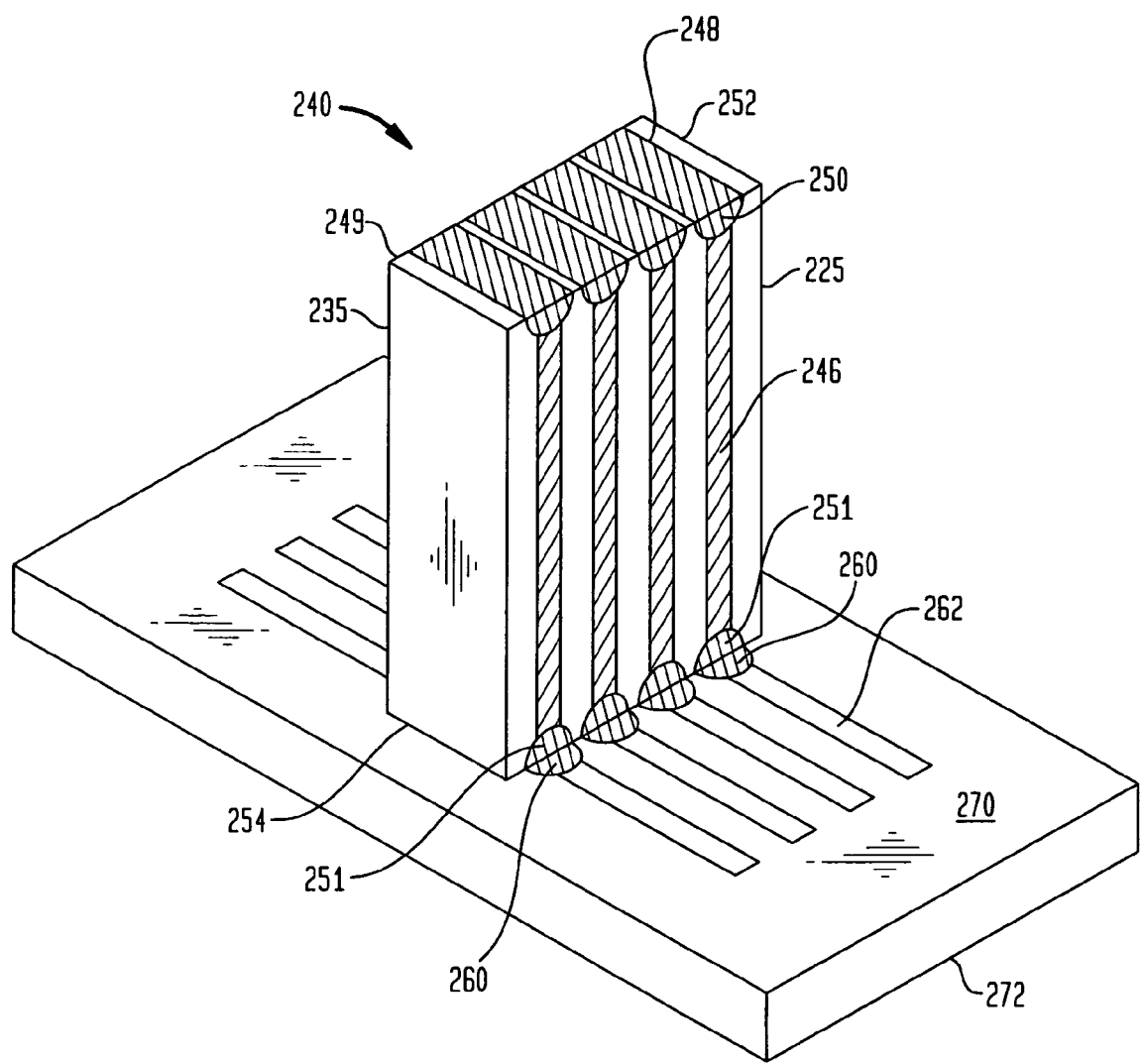
FIG. 4A is a perspective view of an interconnect panel connected to a lower circuit panel in accordance with an embodiment of the invention.
Figure 4B:
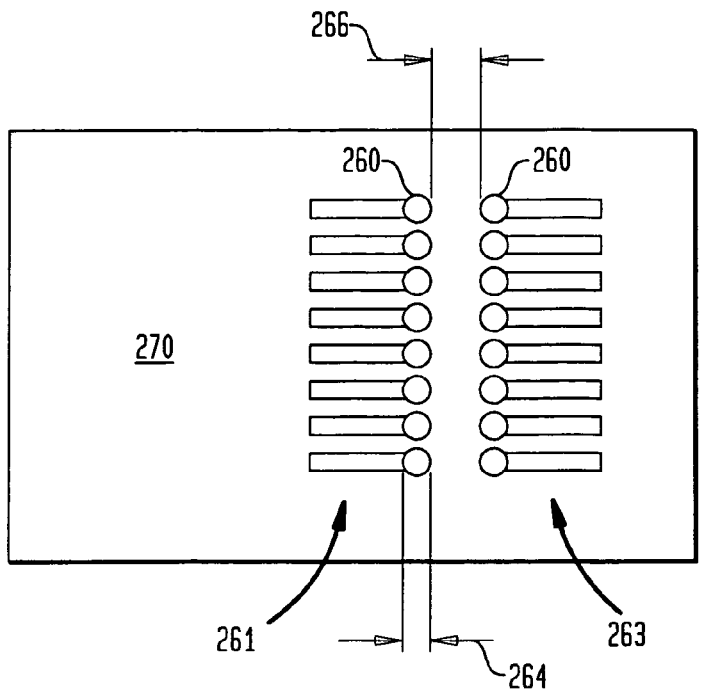
FIG. 4B is a top-down plan view of an exposed surface of a circuit panel to which an interconnect panel is to be connected according to one embodiment of the invention.

FIG. 4B is a top-down plan view illustrating a preferred spacing of two rows of conductive pads 260 exposed at the top surface 270 of the lower circuit panel. A first or "left-side" row 261 of pads is to be mounted to a row of corresponding pads exposed at a first edge of the front surface 225 with either the top end 152 or the bottom end 154, or to a row of corresponding pads at one edge of the rear surface 235 with either the top end 152 or the bottom end 154. A second or "right-side" row 263 of pads is to be mounted to a row of corresponding pads (not shown) exposed at an edge of the interconnect panel opposite the first edge. As further shown in FIG. 4B, each pad 260 preferably has a diameter 264 which is somewhat larger than the width of the conductive trace 262 to which it is connected. The distance between edges of each pad 260 is referred to as the "pad space" 266.

Figure 4C:
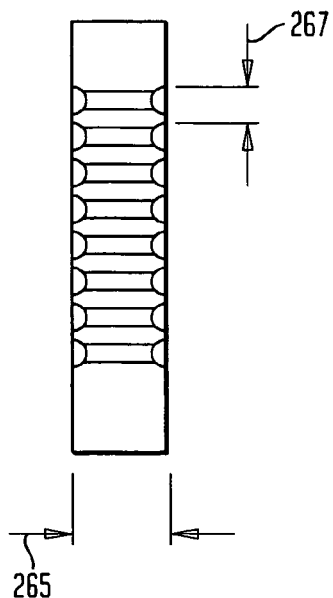
FIG. 4C is a bottom plan view of an exposed surface of an interconnect panel according to the embodiment of the invention shown in FIG. 4A.

FIG. 4C is a plan view of the interconnect panel 240 looking towards a bottom end 254. As shown therein, the interconnect panel has a thickness 265, being essentially the thickness of the dielectric element thereof, and a pitch 267, which is defined as the center-to-center distance between adjacent parallel conductive traces exposed at the bottom end 254.

Figure 4D:
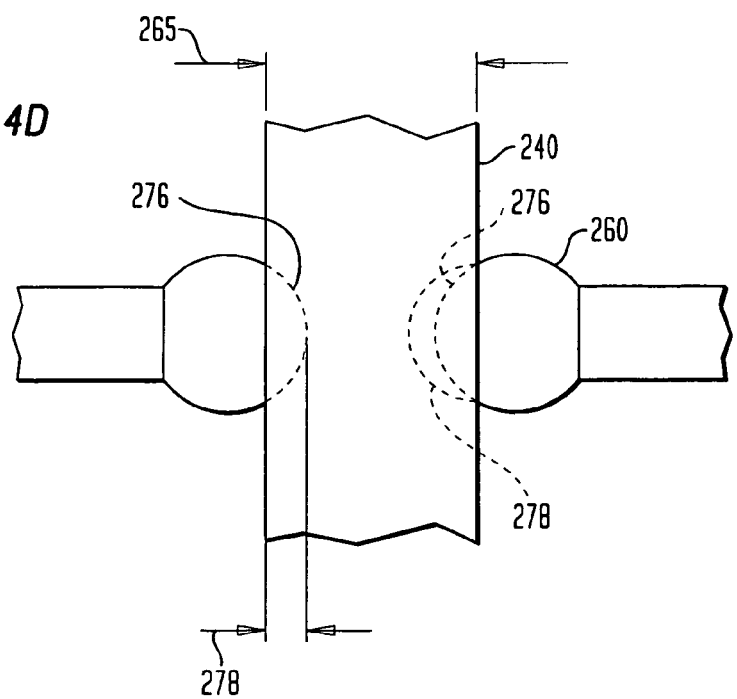
FIG. 4D is a top-down plan view of an interconnect panel and a circuit panel connected thereto in accordance with an embodiment of the invention.

FIG. 4D is a partial top-down plan view illustrating a preferred arrangement for aligning and mounting the conductive pads of the interconnect panel 240 to conductive pads of the lower circuit panel 272. As shown in FIG. 4D, the interconnect panel 240 preferably overlaps edges 276 of the conductive pads 260 of the lower circuit panel 272, by a distance 278. As further shown in FIG. 4D, the conductive pads (shown in dotted line form as underlying interconnect panel 240) are preferably only partially overlapped by the conductive pads 260 of the lower circuit panel. Again, 265 denotes the thickness of the interconnect panel.

Surface tension is created when molten solder is applied to the conductive pads of the interconnect panel. The structure in which conductive pads 251 are disposed on the front and rear surfaces of the interconnect panel is beneficial to the formation of solder fillets on the front and rear surfaces. Moreover, since each row of pads 261, 263 is disposed at a space 266 which is smaller than or no greater than the thickness of the interconnect panel, this helps to assure that conductive material, e.g., solder, conductive paste, disposed on the conductive pads of the lower circuit panel will flow onto the conductive pads 251 on the front or rear surface of the interconnect panel. This, in turn, helps the interconnect panel to be disposed at a right angle to the lower circuit panel.

While the above embodiment has been described relative to connecting a bottom end of an interconnect panel to a lower circuit panel, the same principles can be applied to connecting a top end of the interconnect panel to an upper circuit panel.

Figure 4E:
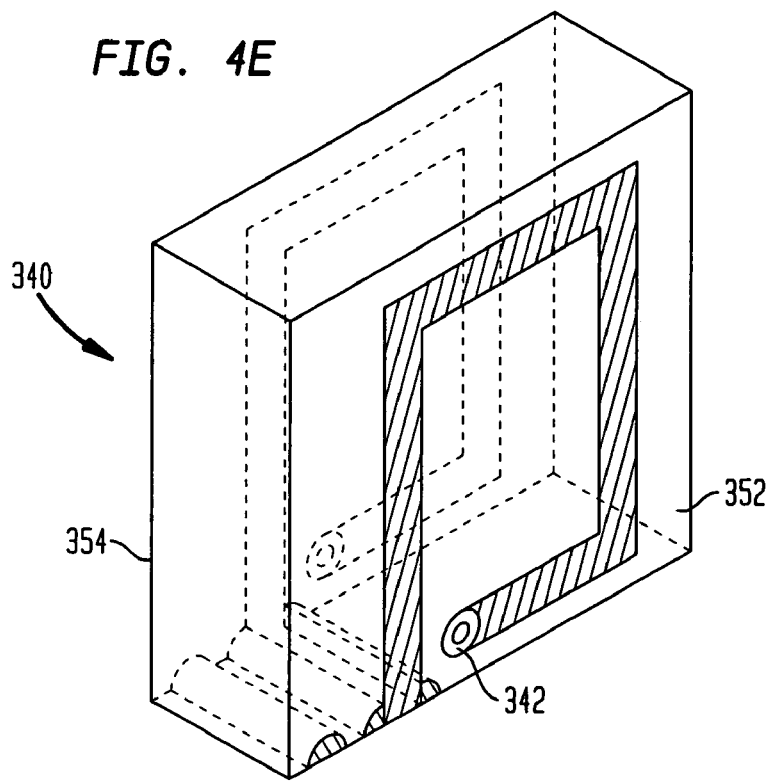
FIG. 4E is a perspective view of a panel having at a spirally shaped inductive element thereon in accordance with one embodiment of the invention.

FIG. 4E is a perspective view of a panel 340 designed to function as an antenna or inductive coil, rather than primarily as an interconnect element. Like the above-described interconnect panels, the panel includes conductive contacts at at least one edge. The contacts may be in form of metalized grooves of conductive traces and pads. In the particular panel shown, an antenna is provided in form of a helical coiled element, formed by spiraled conductive traces formed on one or more dielectric layers of the panel 340. Metalized through vias 342 can provide interconnection between respective layers. Alternatively, metalized grooves or traces extending between the front surface 352 and the rear surface 354 at the top end or bottom end can provide interconnection between respective layers.

The panel 340 can function as a stand-alone antenna element for mounting to a circuit panel in a manner similar to that described relative to FIG. 4D, for example. The panel 340 can include interconnect traces as well as inductive, e.g., antenna elements, or can even provide interconnect traces combined with inductive elements. Thus, the panel 340 can be used in stacked assemblies at locations where an interconnect panel or such as described above would be used, or can be mounted at other locations in stacked assemblies which already have such interconnect panels. Commonly owned, co-pending U.S. patent application Ser. No. 10/452,333, filed Jun. 2, 2003, hereby incorporated by reference herein, discloses many possible types of antenna and inductive elements, at least some of which can be incorporated in panel 340.

Figure 5:
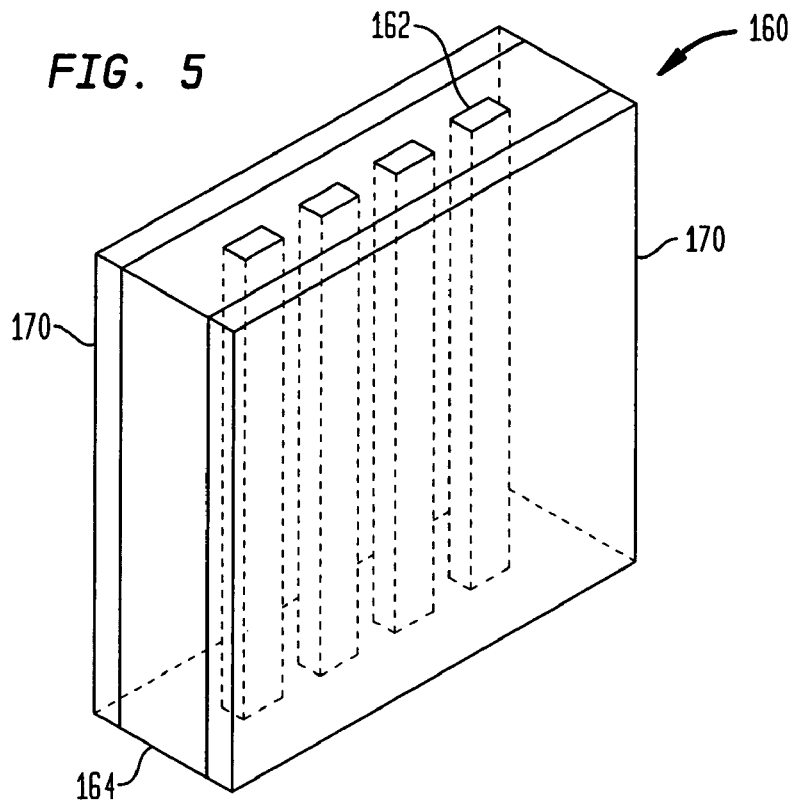
FIG. 5 is a perspective view of an interconnect panel having internal conductive elements disposed between external conductive planes, in accordance with an embodiment of the invention.

In an alternative interconnect panel 160, as shown in FIG. 5, the interconnect panel includes conductive planes 170 disposed on the front and back surfaces of a dielectric element 164, and the interconnect traces 162 are disposed internally within the dielectric element 164, such that interconnect traces 162 are disposed in a strip-line arrangement in relation to the conductive planes 170. Such strip-line arrangement permits good transfer of signals along the internal interconnect traces 162, especially for signals in higher radio frequency ranges.

The particular mounting arrangement of the circuit panels and interconnect panels is further shown in the sectional view of FIG. 2. The features referenced in FIGS. 1 and 3A-3B are also referenced in FIG. 2 to the extent that they appear therein. As shown in FIG. 2, bottom ends of first level interconnect panels 140 have contacts 148 mounted to terminals 106 on a top surface 112 of the first circuit panel 102, as by masses of solder 155. A similar technique is used to mount the interconnect panels 140 to the second circuit panel, and to mount second level interconnect panels 142 to the second and third circuit panels 130, 150. Alternatively, diffusion bonding, adhesive bonding, eutectic bonding, or any other suitable method can be used to bond the contacts 148 of the interconnect panels 140, 142 to the first and second circuit panels.

An alternative technique is illustrated for mounting the second level interconnect panels 142 to the third circuit panel 150. As shown, conductive traces 146 on the front surface of interconnect panels 142 are bonded by solder masses 126 to terminals 116 on the front surface 157 of the third circuit panel 150. As further shown in FIG. 2, the first, second and third circuit panels 102, 130, 150 preferably have metalized sidewalls 136 for conductively connecting their conductive (ground) planes 105 together. Alternatively, other conductive elements such as metalized through holes, metalized grooves, conductive adhesives or solder masses may be used to conductively connect the conductive planes 105 of the circuit panels and the interconnect panels.

Figure 6A:
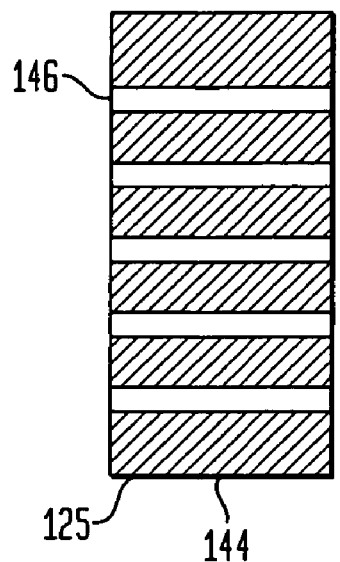
FIGS. 6A-6D are views illustrating an interconnect panel in accordance with one embodiment of the invention.
Figure 6B:
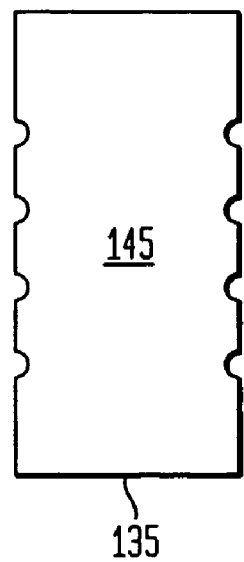
Figure 6C:
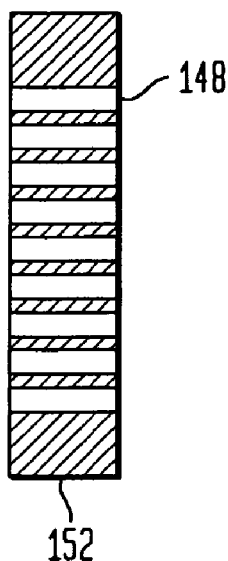
Figure 6D:
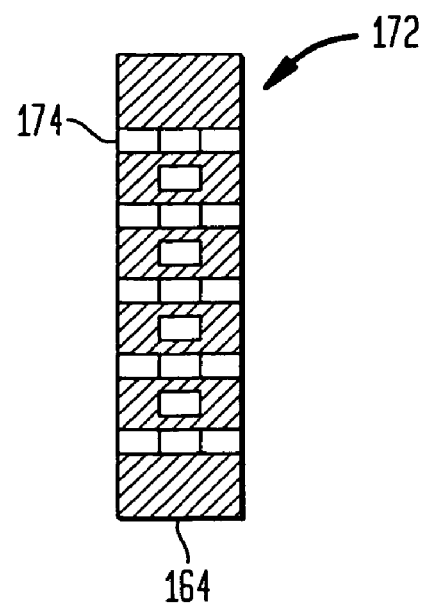

FIGS. 6A-6C are plan views further illustrating the front surface 125, rear surface 135, and top end 152 of the interconnect panel described above relative to FIGS. 3 and 4. FIG. 6A illustrates the interconnect traces 146 disposed on the dielectric element 144 on the front surface 125. FIG. 6B illustrates the conductive plane 145 disposed on the rear surface 135. FIG. 6C illustrates contacts 148 disposed on the top end 152. While not specifically shown, the bottom surface has a similar appearance. FIG. 6D illustrates a top end of an alternative interconnect panel 172 having an arrangement similar to that shown in FIG. 5, except that ground traces 174 extend across the top end of the dielectric element. 164.

FIG. 6E illustrates a method of fabricating an interconnect panel 140 such as that shown in FIGS. 3-4. As shown in a plan view of the front surface 610 thereof, a dielectric element 600, sized for a typical circuit board application, such as a BT resin board, is fabricated to have conductive traces 602 extending along the front surface 610. Metalized through holes 604 extend from the front surface 610 to the rear surface (not shown). The dielectric element is cut along lines 620 and 622 to provide the interconnect panel, wherein the conductive traces 602 become the interconnect traces of the interconnect panel, and the metalized through holes or metalized vias are cut to become the contacts of the interconnect panel, the contacts appearing as grooves in the top and bottom surfaces of the interconnect panel.

Figure 7:
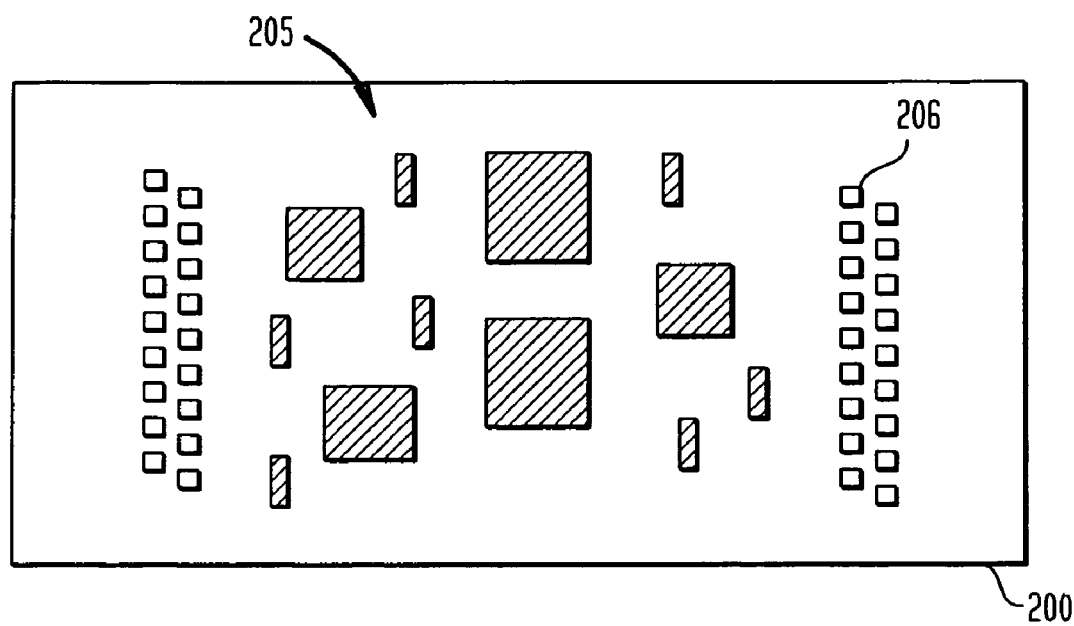
FIG. 7 is a plan view of a top surface of a circuit panel to which other elements are to be mounted according to one embodiment of the invention.

FIG. 7 is a plan view of a top surface of a circuit panel 200 having components 205, e.g., one or more chips, discrete or integrated passive components mounted thereto, the circuit panel 200 to be interconnected to another circuit panel in a manner similar to that described above relative to FIGS. 1 and 2. Circuit panel 200 includes a plurality of terminals 206, each being horizontally offset in two directions from each other terminal 206. Such arrangement permits closely spaced linearly extending contacts 148 on the top or bottom ends 152, 154 (FIGS. 3-4) to be bonded to neighboring ones of the terminals 206.

Figure 8:
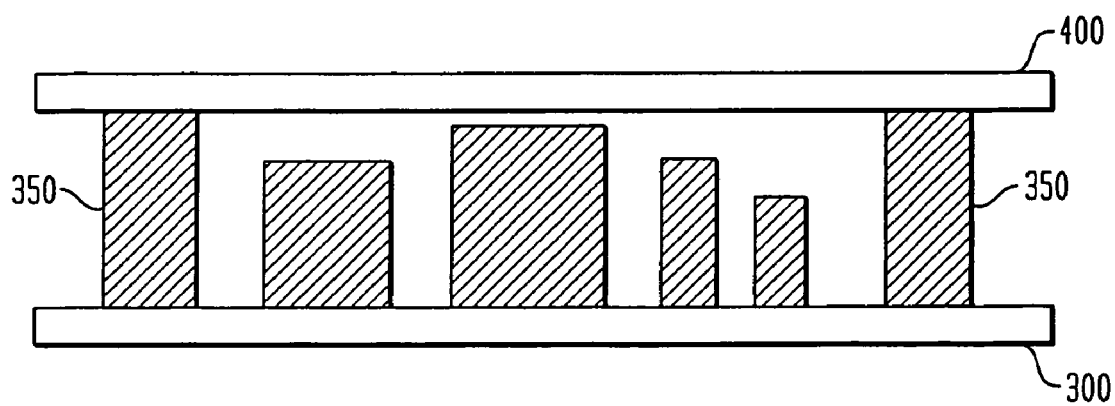
FIG. 8 is an elevational view illustrating a stacked microelectronic assembly according to an embodiment of the invention.

FIG. 8 illustrates a variation of the stacked assembly shown and described above with respect to FIGS. 1 and 2. As shown in FIG. 8, the first and second circuit panels 300, 400 overhang beyond the interconnect panels 350.

Figure 9:
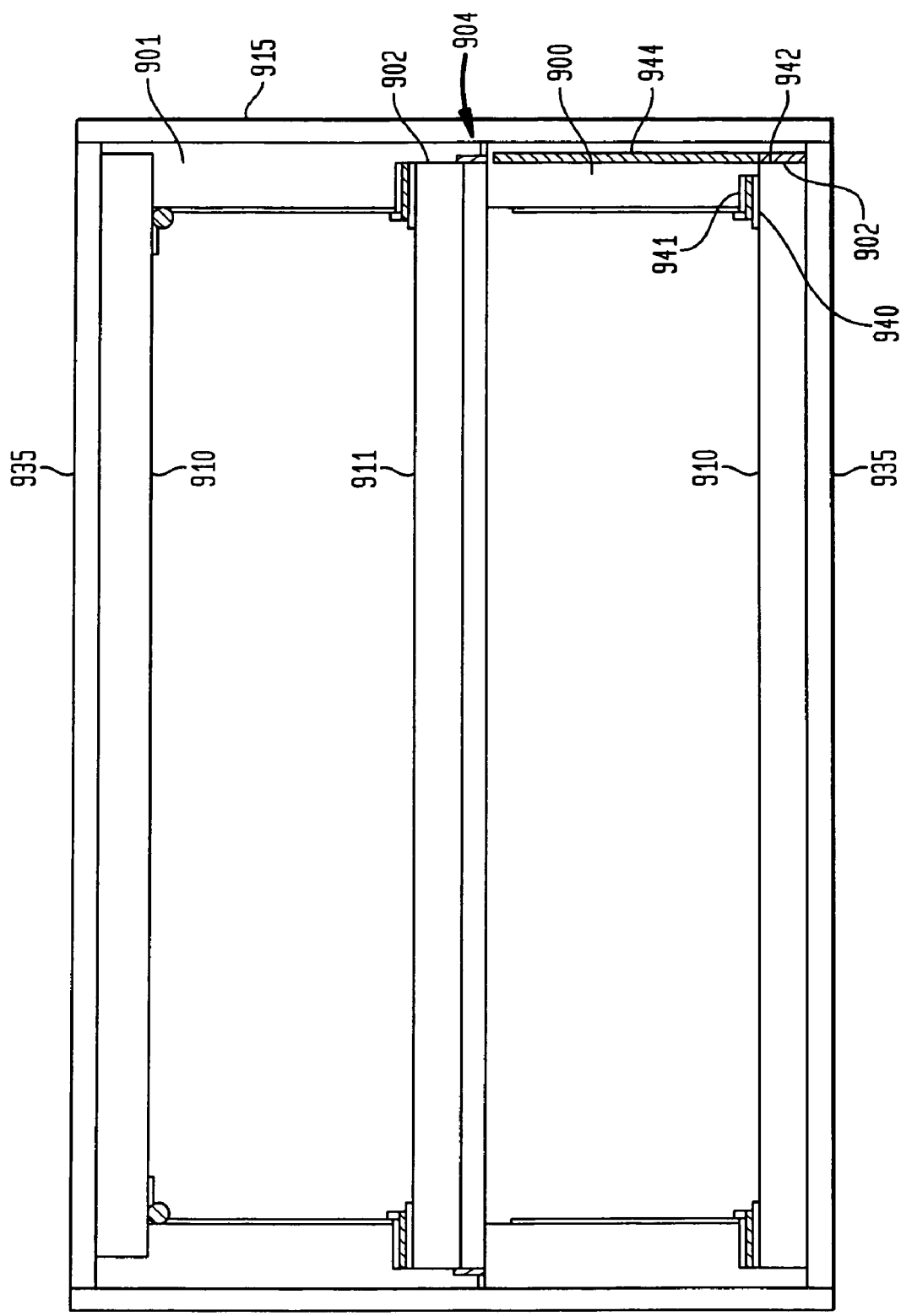
FIG. 9 is a sectional view of a stacked microelectronic assembly in accordance with one embodiment of the invention.
Figure 10:
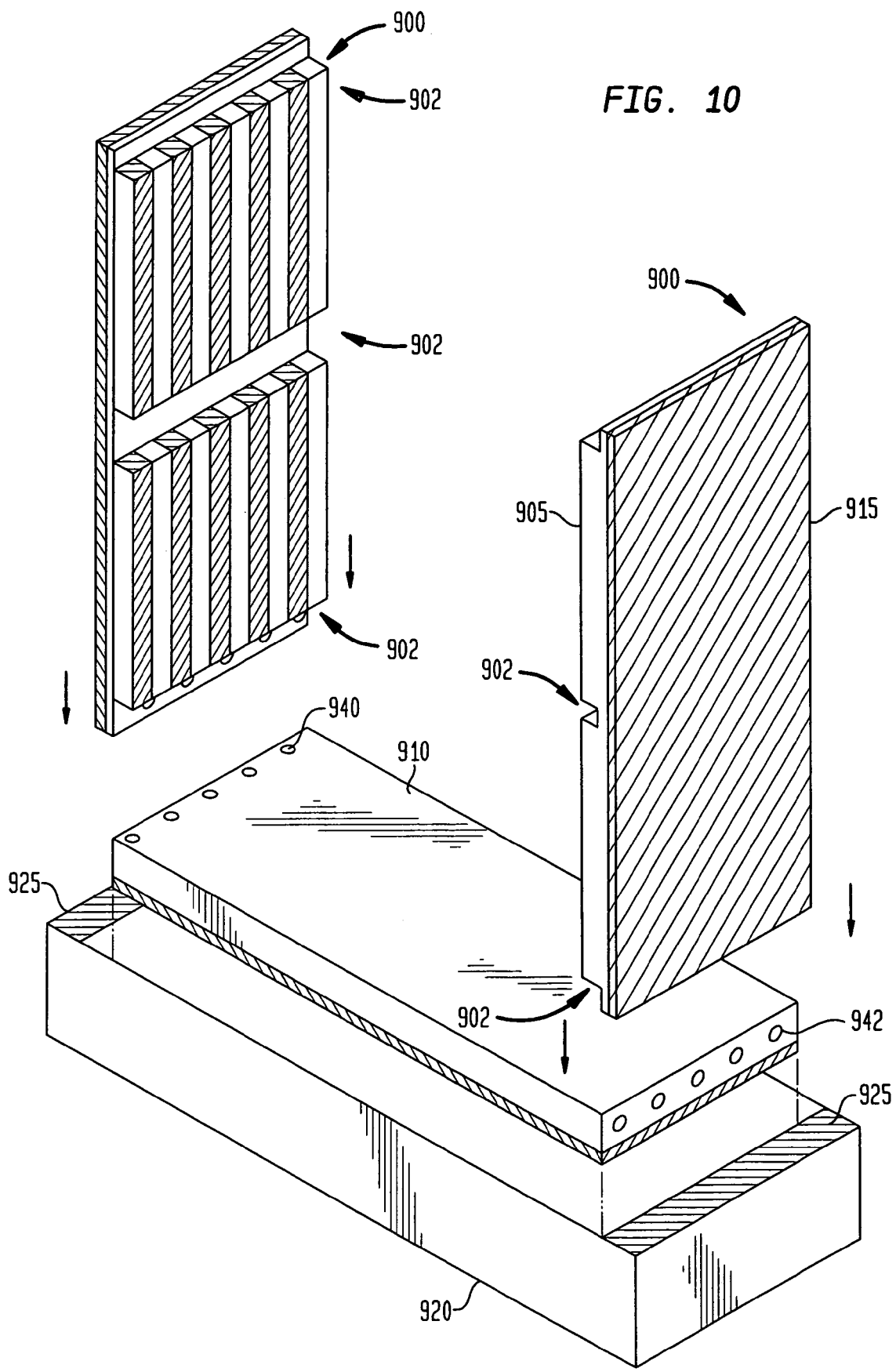
FIG. 10 is a corresponding perspective view of the stacked assembly shown in FIG. 9.

FIGS. 9 and 10 illustrate an alternative embodiment in which each circuit panel 910 is disposed in a shelf-like arrangement in a stacked assembly. FIG. 9 is a sectional view, and FIG. 10 is a perspective view. In this arrangement, the circuit panel 910 preferably includes a ground plane 935, and the circuit panel 910 is conductively mounted to a motherboard 920 for power, ground and heat conduction. The conductive plane 935 preferably includes open areas or other openings in which bottom terminals (not shown) of the circuit panel 910 are disposed, at least some of the bottom terminals being connected to some of the terminals 940 disposed on the top surface of the circuit panel 910. In such way, signal transfer may also be provided to and from motherboard 920. In this arrangement, the interconnect panels 900 have notches 902 disposed in front surfaces 905 thereof on which conductive traces are disposed. The interconnect panels 900 have conductive planes 915, preferably being ground planes, the conductive planes 915 preferably being mounted to ground and/or heat conductors disposed on the motherboard 920. An advantage of this arrangement over that shown and described relative to FIGS. 1 and 2 is the continuous conductive plane that extends vertically to connect each of the first, second and third circuit panels. The conductive plane 915 is preferably mounted directly to the ground planes 935 of the bottom and top ones of the circuit panels 910. However, a connection 904 to the conductive plane 915 may be provided through the dielectric element 901 in the case of the middle circuit panel 911. Similar to the embodiment described above relative to FIGS. 1 and 2, terminals 940 on a top surface of the circuit panel 910 are preferably bonded to terminals 941 on a bottom end of the interconnect panel 900. In a preferred arrangement, terminals 942 on an end surface of the circuit panel 910 are connected to internal traces 944 of the interconnect panel 900.

Figure 11:
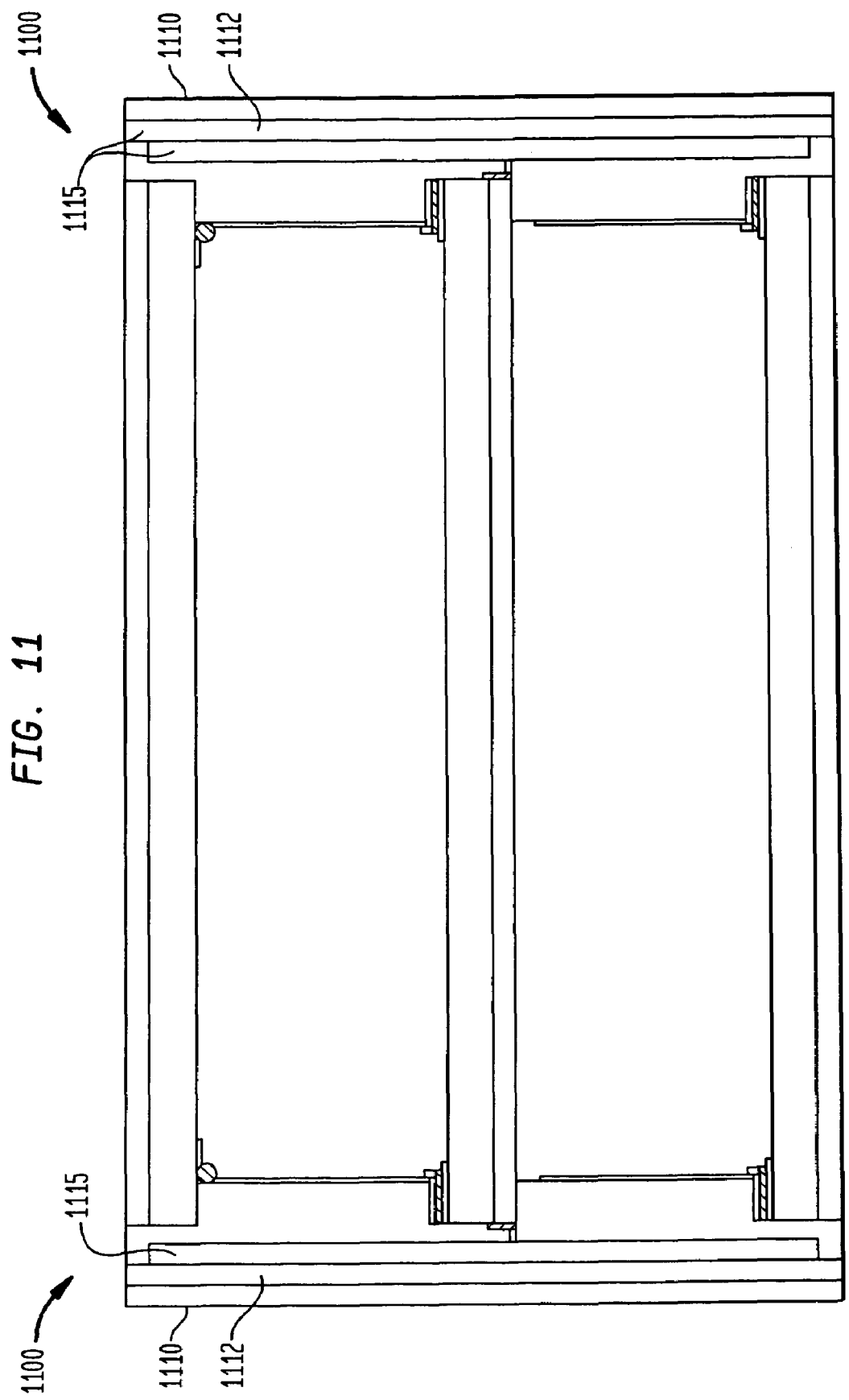
FIG. 11 illustrates a variation of the embodiment described relative to FIGS. 9 and 10, in which one or more inductive elements are integrated into interconnect panels of a stacked assembly.

FIG. 11 illustrates a variation of the embodiment described relative to FIGS. 9 and 10, in which one or more inductive elements 1110, e.g., antennas, are integrated into interconnect panels 1100 of a stacked assembly. The inductive elements may include those such as described in commonly owned co-pending U.S. patent application Ser. Nos. 10/210,160 filed Aug. 1, 2002 and 10/452,333 filed Jun. 2, 2003, the disclosures of which are hereby incorporated herein by reference. In this arrangement, conductive planes 1115 are disposed internally within the interconnect panels 1100, and are separated from the inductive elements 1110 by dielectric layers 1112, so as to provide shielding relative to the inductive elements.

Figure 12:
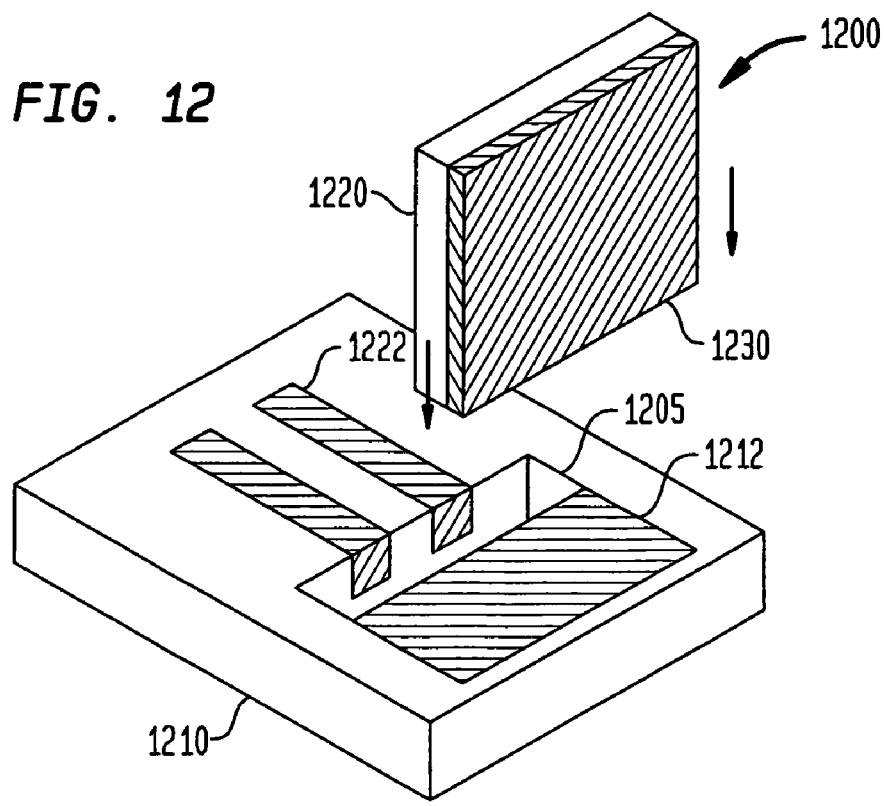
FIGS. 12-14 are perspective views illustrating further embodiments in which interconnect panels are mounted to circuit panels.
Figure 13:
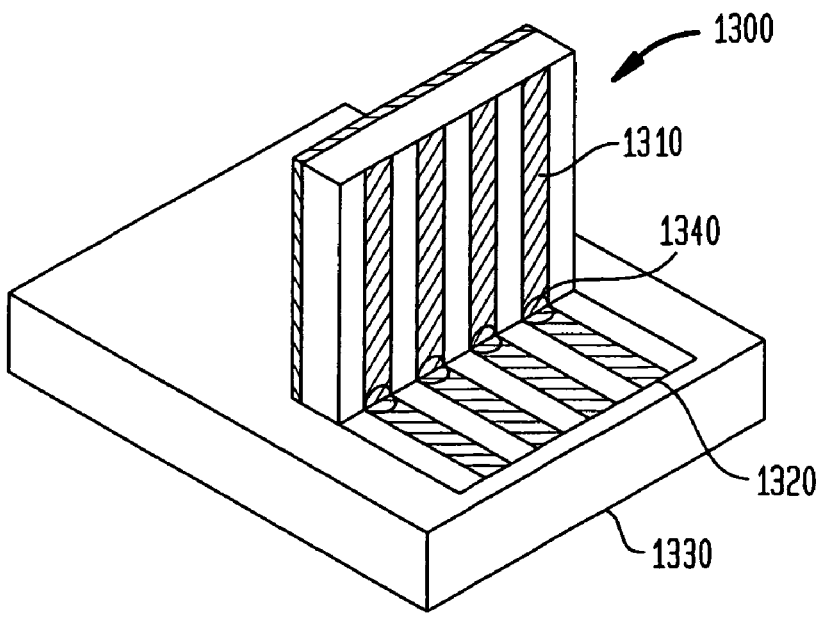
Figure 14:
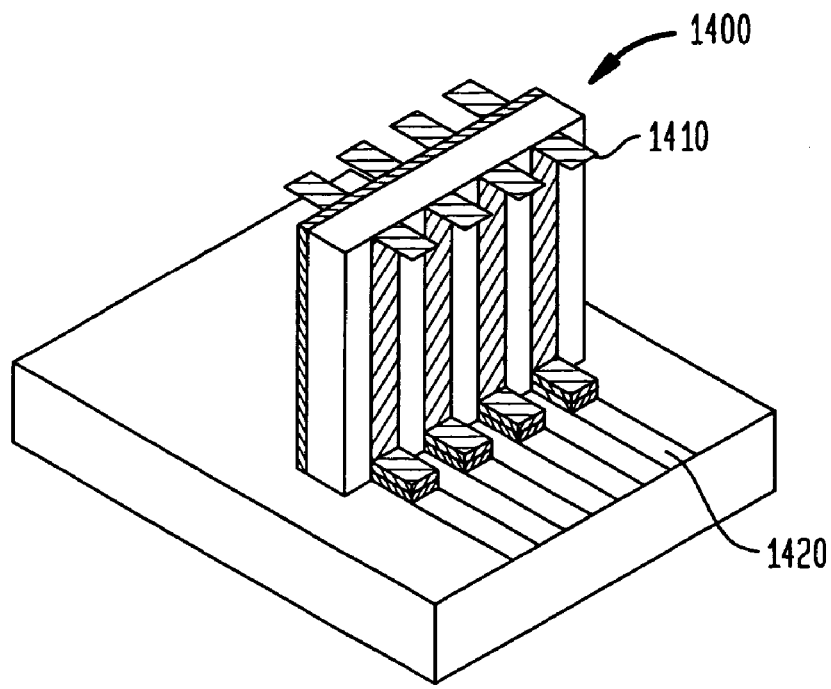

FIGS. 12-14 illustrate further arrangements for mounting interconnect panels to circuit panels, according to various embodiments of the invention. As shown in FIG. 12, an interconnect panel 1200 has a lower end 1202 sized to fit within an opening 1205 of a circuit panel 1210. Conductive traces (not shown) on a front surface 1220 of the interconnect panel are conductively connected to terminals of the circuit panel 1210, as by pressure fit, soldering, bonding, or conductive adhesive bonding, etc. A conductive and/or thermally conductive plane 1230 disposed on a rear surface of the interconnect panel 1200 is conductively connected to a conductive and/or thermally conductive element 1212 of the circuit panel.

FIG. 13 further illustrates an embodiment in which an interconnect panel has traces 1310 thereon which are bonded directly to traces 1320 on the front surface of a circuit panel 1330 by solder masses 1340 disposed thereon. One possible way of performing such soldering is to provide ring-shaped solder masses spaced apart on a rod of glass, or other material which may be a temporary element, and to contact the interconnect panel 1300 and the circuit panel 1330. simultaneously with such rings to melt the rings and bond the traces 1310 of the interconnect panel to the traces 1320 of the circuit panel 1330.

FIG. 14 illustrates an alternative embodiment of an interconnect panel 1400 in which conductive traces are provided with extensions 1410 integrated thereto, the extensions provided for mounting to traces 1420 of the circuit panel.

Figure 15:
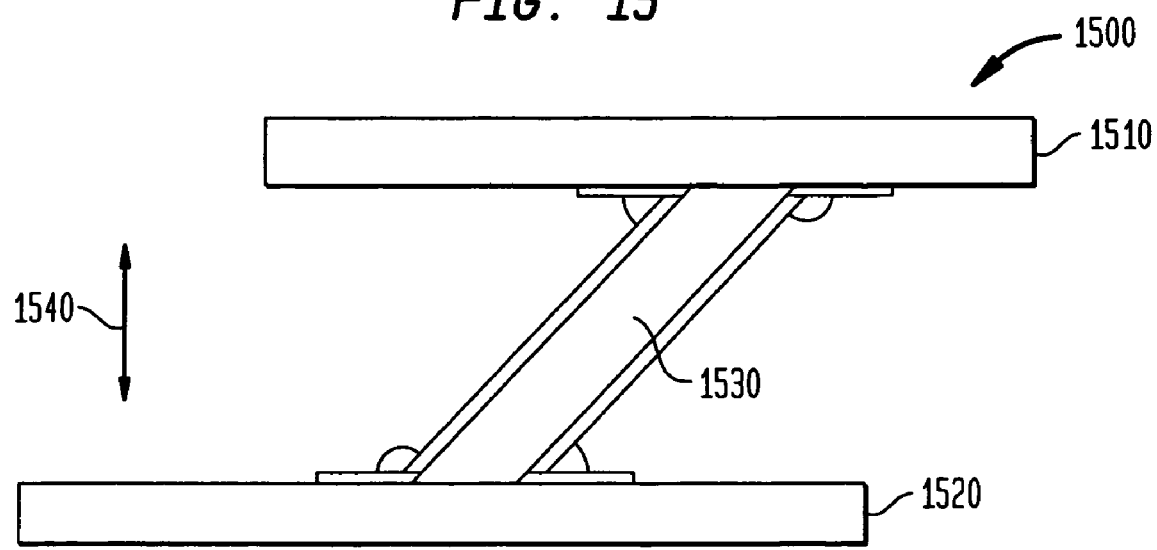
FIG. 15 is an elevational view illustrating an assembly according to another embodiment of the invention in which an overlying circuit panel only partially overlies a lower circuit panel.

FIG. 15 further illustrates an assembly 1500 in which an overlying circuit panel 1510 only partially overlies a lower circuit panel 1520, and the two circuit panels are interconnected by way of an interconnect panel 1530 that is slanted relative to a vertical axis 1540 of the assembly.

The foregoing description should be taken by way of illustration rather than by way of limitation of the present invention. Certain aspects of the present invention are described in the appended claims.

The invention claimed is:

1. An assembly, comprising:
   (a) a first circuit panel having a top surface, and including:
       a first dielectric element, and
       first conductive traces disposed on said first dielectric element;
   (b) a second circuit panel having a bottom surface, and including:
       a second dielectric element, and
       second conductive traces disposed on said second dielectric element,
       at least a portion of said second circuit panel overlying at least a portion of said first circuit panel; and
   (c) an interconnect circuit panel that includes a third dielectric element having a bottom end that abuts the top surface of the first circuit panel, a top end that abuts the bottom surface of the second circuit panel, a front surface extending between the top end and the bottom end, a rear surface opposite said front surface and extending between the top end and the bottom end, and a plurality of interconnect traces each one being respectively disposed on said front surface or said rear surface of said third dielectric element and contacting that surface, at least some of said first conductive traces of the first circuit panel being in electrically conductive communication with said second conductive traces of the second circuit panel through said interconnect traces.

2. An assembly as claimed in claim 1 wherein said interconnect circuit panel includes an electrically conductive plane separated from said interconnect traces by said dielectric element.

3. An assembly as claimed in claim 1 wherein said interconnect panel includes top contacts exposed at said top end, and bottom contacts exposed at said bottom end, at least some of said interconnect traces being connected to at least some of said top and bottom contacts, said first circuit panel having top terminals exposed at said top surface, said second circuit panel having bottom terminals exposed at said bottom surface, at least some of said bottom contacts being bonded to at least some of said top terminals, at least some of said top contacts being bonded to at least some of said bottom terminals.

4. An assembly as claimed in claim 2 wherein said first circuit panel includes a first electrically conductive plane and said second circuit panel includes a second electrically conductive plane, wherein said first and second electrically conductive planes are in conductive communication with each other through said electrically conductive plane of said interconnect circuit panel.

5. An interconnect element, comprising:
a dielectric element having a bottom surface, a top surface disposed opposite said bottom surface, a front surface extending between said top surface and said bottom surface, and a rear surface extending between said top surface and said bottom surfaces, said front surface being disposed opposite said rear surface;
a plurality of front conductive traces each being disposed on and contacting said front surface, said front conductive traces extending in a vertical direction between said top surface and said bottom surface;
at least one rear conductive element disposed on and contacting said rear surface, said at least one rear conductive element extending in a vertical direction between said top surface and said bottom surface; and
at least one of:
a plurality of top contacts disposed on said top surface, said plurality of top contacts conductively connected to said front conductive traces and said at least one rear conductive element, or
a plurality of bottom contacts disposed on said bottom surface, said bottom contacts conductively connected to said front conductive traces and said at least one rear conductive element.

6. The interconnect element as claimed in claim 5, wherein said front surface defines a front plane, said rear surface defines a rear plane, said bottom surface defines a bottom plane and said top surface defines a top plane, said front plane intersecting at least one of said bottom plane and said top plane at an at least substantially right angle, said interconnect element further comprising a plurality of conductive lands having at least substantially planar portions disposed on said front surface in conductive communication with said front conductive traces.

7. The interconnect element as claimed in claim 5, wherein said dielectric element is a material selected from the group consisting of FR-4, BT resin, epoxy glass resin, and glass.

8. The interconnect element as claimed in claim 6, wherein said plurality of top contacts includes at least substantially planar top conductive traces extending in a direction of said top plane.

9. The interconnect element as claimed in claim 6, wherein said rear conductive element includes a plurality of rear conductive traces and said interconnect element further comprises a plurality of conductive lands having at least substantially planar portions disposed on said rear surface in conductive communication with said rear conductive traces.

10. The interconnect element as claimed in claim 7, wherein said top and bottom surfaces define top and bottom planes, respectively and said top and bottom contacts include metallized grooves oriented in directions of said top and bottom planes, respectively, said metallized grooves connected to said front conductive traces and said at least one rear conductive element.

11. The interconnect element as claimed in claim 8, wherein said plurality of top contacts includes top contact lands having at least substantially planar portions disposed on said top surface in conductive communication with said top conductive traces.

12. The interconnect element as claimed in claim 10, wherein said front surface defines a front plane, said rear surface defines a rear plane, said bottom surface defines a bottom plane and said top surface defines a top plane, said front plane intersecting at least one of said bottom plane and said top plane at an at least substantially right angle, said interconnect element further comprising a plurality of conductive lands having at least substantially planar portions disposed on said front surface in conductive communication with said front conductive traces.

13. The interconnect element as claimed in claim 10, wherein said at least one rear conductive element includes a ground plane covering said rear surface of said dielectric element.

14. The interconnect element as claimed in claim 10, wherein said at least one rear conductive element includes a plurality of vertically extending ground traces.

15. The interconnect element as claimed in claim 10, wherein said front and rear surfaces define front and rear planes, respectively, and said front, rear, top and bottom planes are each disposed substantially at right angles relative to respective adjoining ones of the front, rear, top and bottom planes.

16. The interconnect element as claimed in claim 11, wherein said at least some of said at least substantially planar portions abut an edge shared by said front surface and said top surface.

17. The interconnect element as claimed in claim 12, further comprising a plurality of conductive lands having at least substantially planar portions disposed on said rear surface, wherein said rear conductive element includes a plurality of rear conductive traces in conductive communication with said conductive lands.

18. The interconnect element as claimed in claim 14, further comprising at least one vertically extending power conductor disposed internally within said dielectric element.

19. The interconnect element as claimed in claim 15, wherein said front conductive traces and said at least one rear conductive element are disposed in vertically extending straight paths between said top and bottom surfaces.

20. The interconnect element as claimed in claim 15, wherein a plurality of rear conductive elements are disposed as conductive traces on said rear surface, and said interconnect element further comprises at least one ground conductor disposed internally within said dielectric element.

21. An assembly including the interconnect element as claimed in claim 15, said assembly further comprising a first circuit panel having a top surface and top terminals disposed on said top surface, wherein said bottom contacts of said interconnect element are conductively mounted to said top terminals.

22. The assembly as claimed in claim 21, wherein said bottom contacts of said interconnect element are conductively joined to said top terminals through at least one bond type selected from the group consisting of a fusible conductive medium, diffusion bond, and adhesive.

23. The assembly as claimed in claim 21, wherein first ones of said top terminals are offset in two horizontal directions from second ones of said top terminals along said top surface of said first circuit panel, said first ones conductively connected to said front contacts, and said second ones conductively connected to said at least one rear conductive element.

24. The assembly as claimed in claim 21, further comprising a second circuit panel having a bottom surface and bottom terminals disposed on said bottom surface, wherein said top contacts of said interconnect element are conductively mounted to said bottom terminals of said second circuit panel.

25. The assembly as claimed in claim 21, further comprising a second circuit panel having top and bottom surfaces and a side surface disposed between said top and bottom surfaces of said second circuit panel, said second circuit panel having side terminals disposed on said side surface, wherein said front conductive traces of said interconnect element are conductively mounted to said side terminals of said second circuit panel.

26. The assembly as claimed in claim 24, wherein said second circuit panel includes a thermally conductive slab, said assembly further comprising a chip mounted to said second circuit panel.

* * * * *

UNITED STATES PATENT AND TRADEMARK OFFICE
CERTIFICATE OF CORRECTION

PATENT NO. : 7,489,524 B2
APPLICATION NO. : 11/143201
DATED : February 10, 2009
INVENTOR(S) : Ronald Green et al.

It is certified that error appears in the above-identified patent and that said Letters Patent is hereby corrected as shown below:

Column 11, line 36, "surfaces" should read --surface--.

Signed and Sealed this

Twenty-seventh Day of April, 2010

David J. Kappos
*Director of the United States Patent and Trademark Office*